United States Patent [19]
Jeon

[11] Patent Number: 5,970,356
[45] Date of Patent: Oct. 19, 1999

[54] METHOD FOR FABRICATING A BIPOLAR TRANSISTOR

[75] Inventor: Chang-ki Jeon, Kyunggi-do, Rep. of Korea

[73] Assignee: Samsung Electronics Co., Ltd., Suwon, Rep. of Korea

[21] Appl. No.: 09/237,884

[22] Filed: Jan. 27, 1999

[30]     Foreign Application Priority Data

Mar. 12, 1998 [KR]   Rep. of Korea ...................... 98-08283

[51] Int. Cl.$^6$ ................................................. H01L 21/331
[52] U.S. Cl. ........................................... 438/361; 438/370
[58] Field of Search ................................... 438/361, 362, 438/364, 369, 370, 372, 309

[56]               References Cited

U.S. PATENT DOCUMENTS

| | | | |
|---|---|---|---|
| 4,871,685 | 10/1989 | Taka et al. ............................... | 438/361 |
| 5,008,208 | 4/1991 | Liu et al. .................................. | 438/361 |
| 5,104,816 | 4/1992 | Verret et al. ............................. | 438/361 |
| 5,332,683 | 7/1994 | Miyashita et al. ....................... | 438/361 |
| 5,814,547 | 9/1998 | Chang ...................................... | 438/361 |

*Primary Examiner*—Tuan H. Nguyen

*Attorney, Agent, or Firm*—Jones Volentine, L.L.P.

[57]               ABSTRACT

A bipolar transistor and a method of fabricating the same are provided which are adapted to reduce chip size and production costs. To produce the transistor, a second conductive type well region is formed in a first conductive type semiconductor substrate and isolation trenches are formed at both sides of the well region. A high density second conductive type buried layer is formed in the semiconductor substrate which is formed at the bottom of the isolation trench. The buried layer is formed in two regions surrounding respective bottoms of two adjacent isolation trenches. The two regions are electrically connected with each other and in direct contact with the well region. An extrinsic base region and a device isolation region are formed sequentially onto the semiconductor substrate using a nitration layer pattern as a mask, wherein the nitration layer pattern is formed on the surface of semiconductor substrate. An intrinsic base region is formed into the well region and an emitter region into the intrinsic base region using the device isolation layer as a mask. The bipolar transistor and method of fabrication can reduce the chip size, the production costs, and the resistance of the collector by forming the isolation trench, wherein the isolation trench is used to form the buried layer and functions as a sink layer (collector layer). The process provides self-alignment of the extrinsic base region, the intrinsic base region, and the emitter region to reduce process scattering.

6 Claims, 6 Drawing Sheets

METHOD FOR FABRICATING A BIPOLAR TRANSISTOR

FIELD OF THE INVENTION

The present invention relates to fabrication of a bipolar transistor, and more particularly to the bipolar transistor and a method for fabricating the same adapted to reduce chip size and production costs.

BACKGROUND OF THE INVENTION

FIG. 1 is a cross-sectional view of a conventional bipolar transistor structure.

Referring to FIG. 1, in conventional bipolar transistor of SBC(Standard Buried Collector) structure, an epitaxial layer (6) is formed on a p-type semiconductor substrate (2). A $n^+$-type buried layer (4) is formed between the semiconductor substrate (2) and the epitaxial layer (6), and a $p^+$-type isolation region (8) is formed at both sides of the $n^+$-type buried layer (4). An $n^+$-type sink layer (10) is formed to be in contact with the upper part of epitaxial layer (6) and the buried layer (4). A p-type base region (12) is formed in the epitaxial layer (6) between the isolation regions (8), and a $n^+$-type emitter region (14) is formed in the p-type base region (12). An emitter electrode (18), a base electrode (19), and a collector electrode (20) are formed through an insulating layer (16) for respective electrical connection with the emitter (14), the base region (12), and the sink layer (10), wherein the insulating layer (16) is formed on the epitaxial layer (6). As described above the SBC structure bipolar transistor reduces the collector resistance by forming the buried layer (4), and increases internal pressure by forming the lightly doped epitaxial layer (6) so that the bipolar transistor is a more ideal device. However, there are problems in that the production cost is increased by forming the epitaxial layer (6) and the chip size is increasing by forming the isolation region (8) separately. Also, it is difficult to reduce the chip size because of diffusion of the sink layer (10), wherein the diffusion occurs by a following annealing.

FIG. 2 is a cross-sectional view of another conventional bipolar transistor structure.

As shown in FIG. 2, in another conventional bipolar transistor of triple diffusion structure, an n-type collector region (24) is formed in a p-type semiconductor substrate (22) and a p-type base region (26) is formed in the collector region (24). An $n^+$-type emitter region (28a) is formed in the base region (26), and a $n^+$-type collector contact region (28b) is formed in the collector region (24) of the outer portion of the extrinsic base region (26). An emitter electrode (32), a base electrode (33), and a collector electrode (34) are formed in order to respectively electrically connect with the emitter region (28a), the base region (26), and the collector contact region (28b) through the insulating layer, wherein the insulating layer is formed on the semiconductor substrate (22). As described above, there are advantages in that the production cost is relatively cheap and the chip size is relatively small because the bipolar transistor having a triple diffusion structure does not require formation of the epitaxial layer and an additional isolation region. However, the bipolar transistor has several problems, as follows. Increasing the quantity of the injecting ions, in order to reduce the collector resistance, makes the formation of the base region (26) and emitter region (28a) difficult, and the internal pressure is decreased. On the other hand, as the quantity of the injecting ions is decreased, the resistance of collector is increased.

SUMMARY OF THE INVENTION

It is an object of the invention to provide a bipolar transistor having good characteristics without the formation of an epitaxial layer as well as an isolation region, and to provide a method for fabricating the same.

It is another object of the present invention to provide a bipolar transistor which can be reduced in chip size and production cost, and to provide a method for fabricating the same.

According to an aspect of the present invention, a method of fabricating a bipolar transistor comprises the steps of: forming a well region in a semiconductor substrate of first conductivity type, the well region having a second conductivity type; etching the semiconductor substrate to form a trench at both sides of the well region; forming a first insulating layer on both sidewalls of the trench; injecting an impurity of the second conductivity type into a bottom of the trench to form a buried layer of the second conductivity type at the bottom thereof, filling up the trench with a conductive layer so as to electrically connect the conductive layer to the buried layer; forming a second insulating layer over the semiconductor substrate; injecting an impurity, of the first conductivity type into the semiconductor substrate using a masking layer whose pattern covers a central portion of the well region to form an extrinsic base region; forming a device isolation region on the semiconductor substrate using the masking layer; removing the masking layer; injecting an impurity of the first conductivity type using the device isolation region as a mask to form an intrinsic base region; and injecting an impurity of the second conductivity type using the device isolation region as a mask to form an emitter region in the intrinsic base region.

According to another aspect of the present invention, a bipolar transistor comprises a semiconductor substrate of first conductivity type; a well region of second conductivity type formed in the semiconductor substrate; an isolation trench formed in the semiconductor substrate and at both ends of the well regions, the isolation trench having an insulating layer formed on both sidewalls of the trench and a conductive layer filled in the trench; a buried layer of the second conductivity type formed of two regions surrounding respective bottom portions of two adjacent isolation trenches and being in direct contact with the well region, these two regions being electrically connected with each other; two extrinsic base regions formed at respective sides of the two adjacent isolation trenches and in the well region; an intrinsic base region formed between the two extrinsic base regions and in the well region; and an emitter region formed on the intrinsic base region.

BRIEF DESCRIPTION OF THE DRAWINGS

This invention may be understood and its objects will become apparent to those skilled in the art by reference to the accompanying drawings as follows.

DETAILED DESCRIPTION OF THE PREFERRED EMBODIMENTS

FIGS. 3A through 3G are cross-sectional views showing processing steps for fabricating a bipolar transistor, wherein a npn transistor is illustrated as an example.

Figure 1:
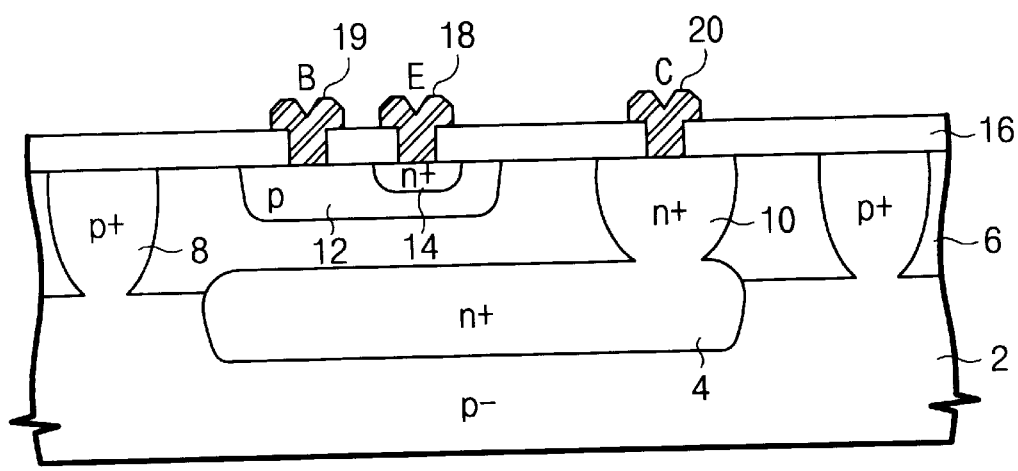
FIG. 1 is a cross-sectional view of a conventional bipolar transistor structure.
Figure 2:
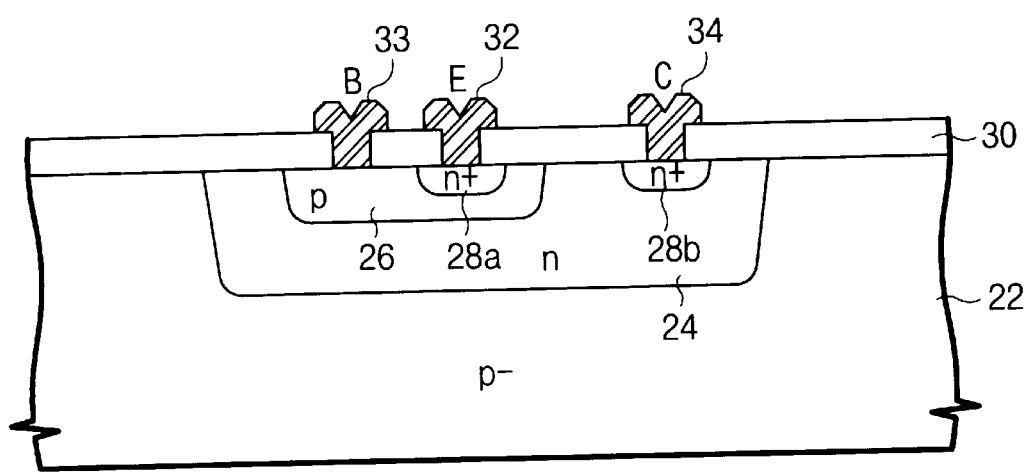
FIG. 2 is a cross-sectional view of another conventional bipolar transistor structure.
Figure 3A:
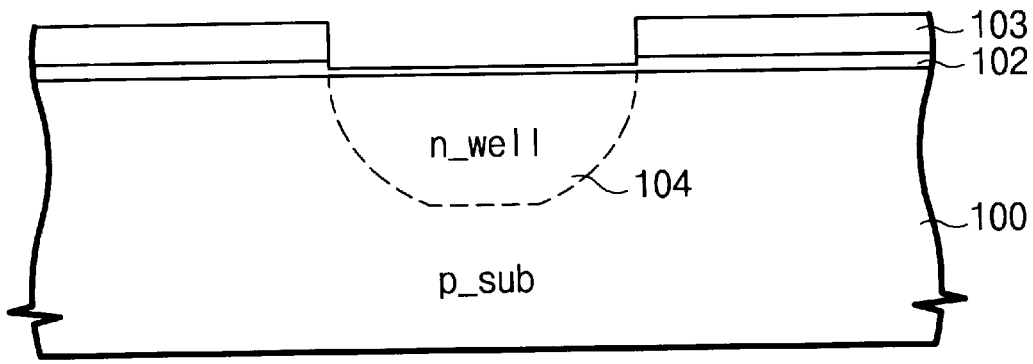
FIGS. 3A through 3G are cross-sectional views showing processing steps for fabricating a bipolar transistor according to the present invention.

Referring to FIG. 3a, first of all, an insulating layer such as a thermal oxide (102) is formed on a p-type semiconductor substrate (100), wherein the thermal oxide (102) is about 1000 Å thick. A photo-resist layer pattern (103) is formed on the thermal oxide (102) in order to expose a well forming region. An etching process is carried out using the photo-resist layer pattern as mask in order to etch the thermal oxide (102) of the exposed region, wherein the thickness of etched thermal oxide (102) is about 500 Å. The etching process is used for substrate alignment of the following process. An n-type impurity injecting process is carried out using the photo-resist layer pattern as the mask and a diffusion process is carried out for forming an n-type well region (104) on the semiconductor substrate (100). The injecting process is desirably carried out using P (phosphorus) ions, at a dose of 1.5E13 ions/cm$^2$, and an ion injecting voltage of 180 keV for forming the n-type well region (104). The diffusing process is desirably carried out in an $N_2$ (nitrogen) environment at 1200° C. for 150 minutes.

Figure 3B:
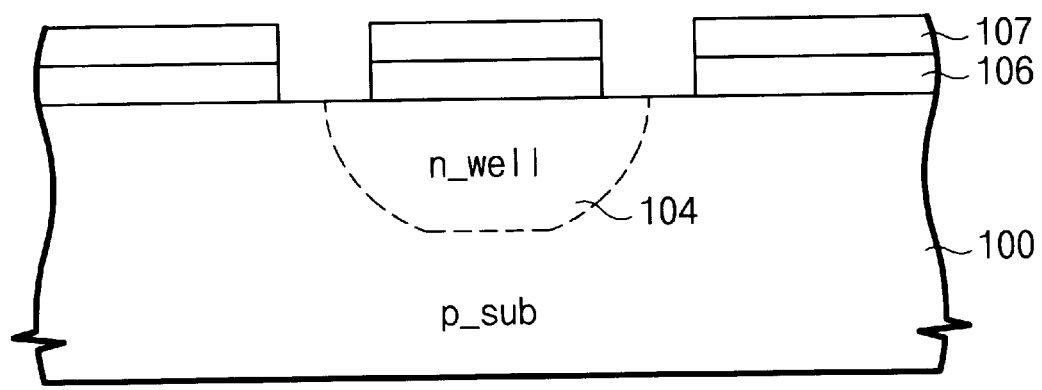

In FIG. 3b, an insulating layer (106) is formed on the semiconductor substrate (100) after removing the photo-resist layer pattern (103) and the thermal oxide (102). An etching process is carried out using a photo-resist layer pattern (107) as a mask to the insulating layer (106), wherein the photo-resist layer pattern (107) is formed on the insulating layer (106), in order to expose a trench forming region.

Figure 3C:
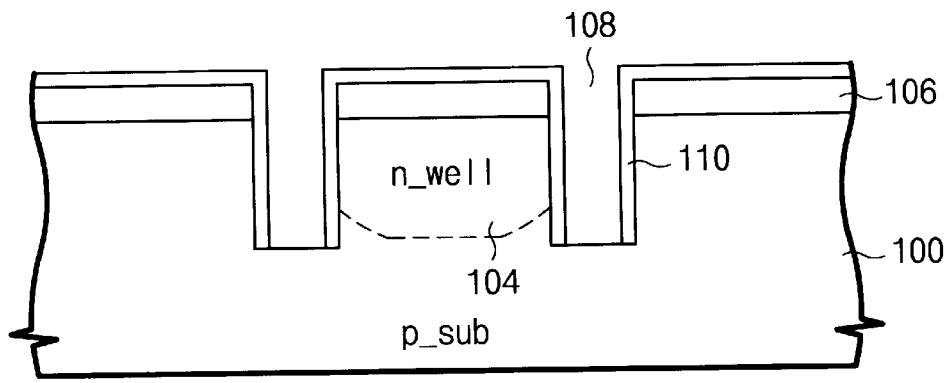

Referring to FIG. 3c, after removing the photo-resist layer pattern (107), an etching process is carried out using the insulating layer (106) as a mask to the semiconductor substrate (100). Trenches (108) are formed, preferably about 2 μm in width and 7 μm in depth. Also, the distance between the trenches (108) is preferably about 6 μm. An insulating layer, such as a thermal oxide (110) is formed onto the inner wall of trenches (108). The thermal oxide (110) is about 1000–2000 Å thick. The thermal oxide (110) located in bottom portion of the trench (108) is removed by anisotropic; etching.

Figure 3D:
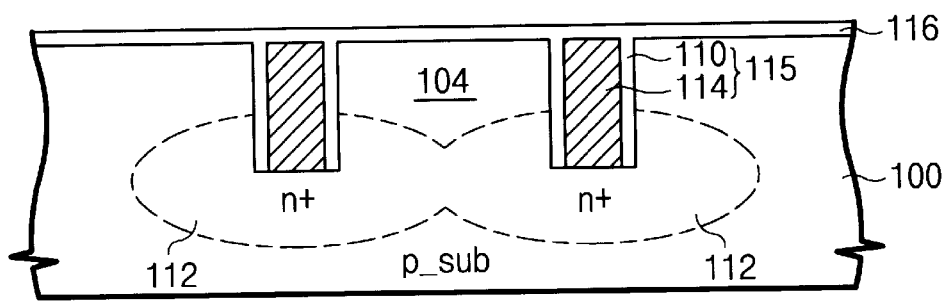

In FIG. 3d, a heavily doped buried layer (112) is formed on the semiconductor substrate (100) located at a bottom portion of the trench (108) by a diffusion process after injecting an n-type impurity into the bottom portion of trench. The injection process is preferably carried out using P (phosphorus) ions, at a dose of 1.5E14 ionS/cm$^2$, and an ion injecting voltage of 180 keV for forming the buried layer (112). The diffusing process is desirably carried out in an $N_2$ (nitrogen) environment at 1200° C. for 150 minutes.

An isolation trench (115) is formed by filling up the trench (108) with a conductive layer (114). For example, the conductive layer (114) is an n-type polysilicon layer or an n-type doped polysilicon layer. Specifically, a planarization process—for example, CMP (chemical mechanical polishing)—is carried out for the n-type polysilicon layer (114) after forming an n-type polysilicon layer on the semiconductor substrate (100) comprising the trench (108). Or, the planarization process—for example, CMP—is carried out for the doped polysilicon layer after forming the polysilicon layer on the semiconductor substrate (100) comprising the trench (108) and the n-type impurity diffusing process is carried out.

The conductive layer (114) filled on the inside of trench is electrically connected with the buried layer (112), wherein the conductive layer (114) is operated as a sink layer (i.e. the collector layer) of the SBC structure transistor. A diffusion process is carried out by a subsequent annealing process, wherein the impurity ion of the conventional sink layer (collector layer) is diffused into both sides of the semiconductor substrate (100). Elsewhere, the impurity ion diffusion is suppressed by the thermal oxide layer (110) so that the present invention can reduce the chip size, wherein the thermal oxide layer (110) is formed on the sidewalls of trench (108). An insulating layer such as a thermal oxide (116) is formed on the surface of semiconductor substrate (100).

Figure 3E:
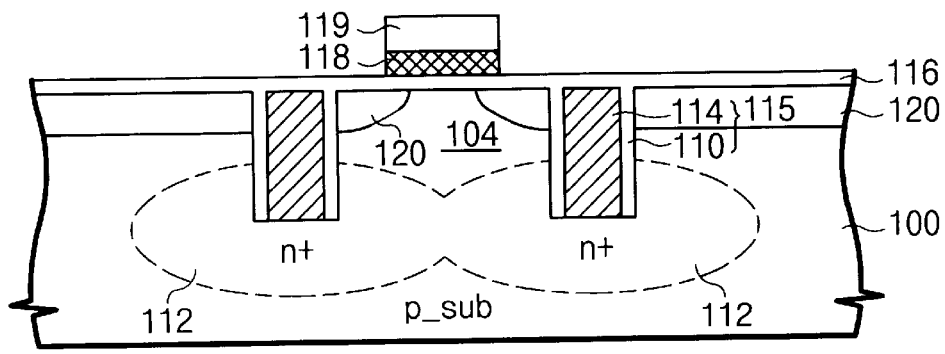

Referring to FIG. 3e, a photo-resist layer pattern (119) is formed for covering an active layer after forming a nitration layer (118) as the mask layer on the thermal oxide (116). More precisely, the photo-resist layer pattern (119) is formed for covering a central portion of the well region. An etching process is carried out using the photo-resist layer pattern (119) as a mask. An injection process is carried out using the photo-resist layer pattern (119) and the nitration layer (118) as a mask, wherein a p-type impurity is injected into the surface of semiconductor substrate (100). After removing the photo-resistor layer pattern (119), an extrinsic base region (120) is formed in the well region (104) on one side of each isolation trench (115) by the p-type impurity diffusion. The nitration layer (118) makes an extrinsic base region (120) formed in self-alignment, wherein the nitration layer (118) is formed for a subsequent LOCOS (local oxidation of silicon) process.

Figure 3F:
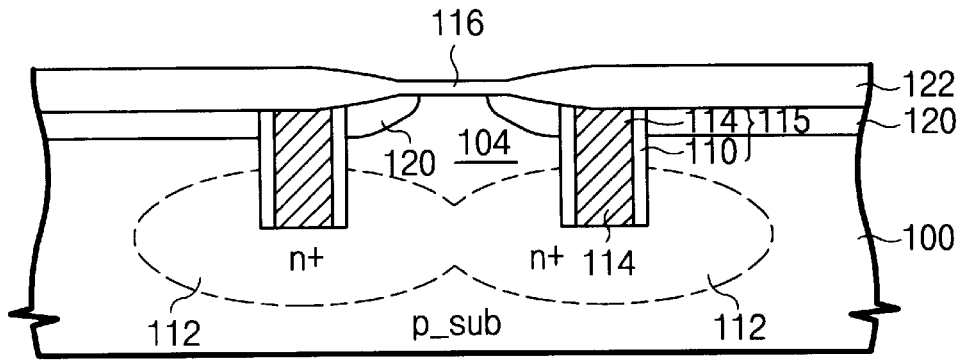
Figure 3G:
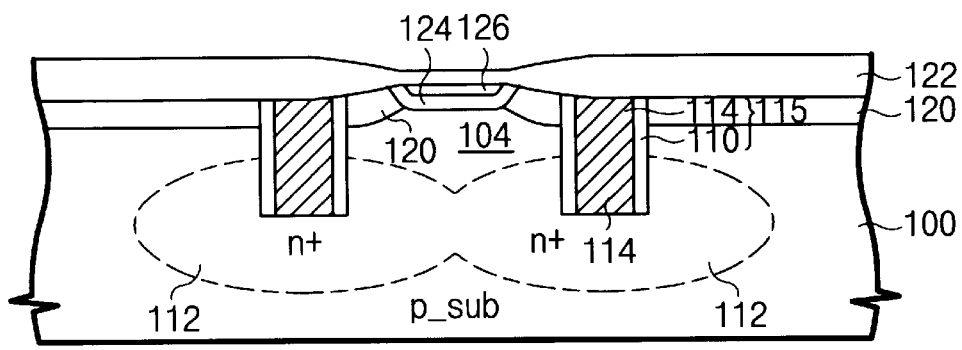

In FIG. 3f, a device isolation region (122) is formed by a thermal oxidation process (i.e. LOCOS process), wherein the process uses the nitration layer (118) as a mask. Next, the nitration layer (118) is removed. At last, a p-type impurity injection process is carried out using the device isolation region (122) as a mask, and a diffusion process is carried out using the p-type impurity so that an intrinsic base region is formed inside the extrinsic base region (120). The intrinsic base region is formed by self-alignment without a photolithography process. In the same matter, a process of injecting an n-type impurity is carried out using the device isolation region (122) as a mask and a diffusion process is carried out for forming an emitter region (126) in an intrinsic base region (124) so that a npn bipolar transistor is formed as shown in FIG. 3g.

As a subsequent process, an insulating layer (128) is formed on the semiconductor substrate (100) comprising the device isolation region (122). A metal pattern (i.e. emitter electrode) is formed in order to electrically connect with the emitter region (126) through the insulating layer and the thermal oxide layer (116) by the photolithography process, wherein the process is well known in this field.

In the fabrication process for a bipolar transistor described above, the number of fabricating steps is less than in conventional methods. For example a conventional fabrication method of the SBC structure bipolar transistor uses 10 photolithographic processes, whereas the fabrication method described here uses fewer, e.g. seven, photolithographic processes. If the method is used for an npn bipolar transistor, only six photolithography processes are needed, because the emitter photolithography process is omitted. Also advantageously, the process of forming the isolation trench (115) is added, instead of the epitaxial layer of a conventional fabrication method. The formation costs of an isolation trench are lower than the conventional costs of forming the epitaxial layer. This results in reduced chip size and collector resistance, because the isolation trench is substituted for the isolation region and the sink layer of a conventional method. The described method of fabricating a bipolar transistor can eliminate the need for an extrinsic base photo, an intrinsic base photo, and/or an emitter photo of a conventional method, because the extrinsic base region (120), the intrinsic base region (124), and the emitter region (126) (if npn transistor) can each be formed by self-alignment.

Figure 4:
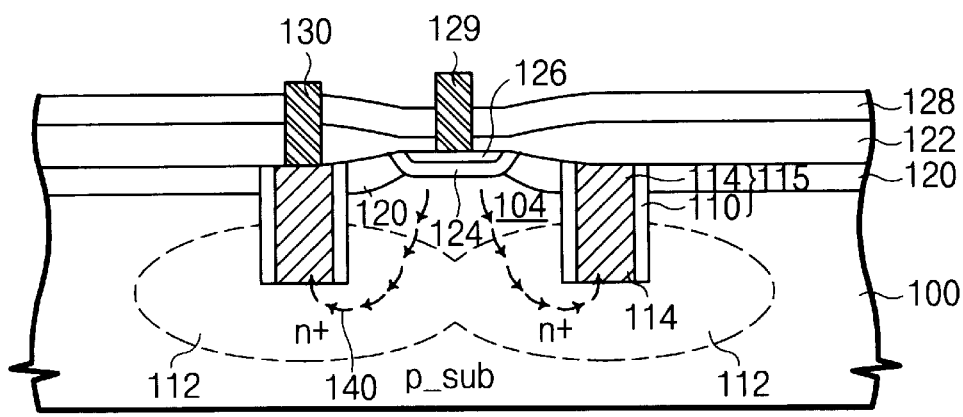
FIG. 4 is a cross-sectional view of the bipolar transistor which is fabricated by the method of FIGS. 3A through 3G.

FIG. 4 is a cross-sectional view of a bipolar transistor which is fabricated by the above-described process. Referring to FIG. 4, the npn transistor comprises the n-type well region (104) formed in the p-type semiconductor substrate (100), and the isolation trenches (115) formed on the sides of the well region (104) of the semiconductor substrate (100). Each isolation trench comprises an insulating layer and a conductive layer. The insulating layer, i.e., the thermal oxide layer (110) is formed on the sidewalls of the trench, and the trench is filled up by the conductive layer. The thermal oxide (110) is preferably formed to a thickness of 1000–2000 Å. The conductive layer is an n-type polysilicon layer (114) or n-type impurity doped polysilicon layer. The conductive layer (114) of the isolation trench reduces the resistance of the collector, wherein the conductive layer functions as a sink layer (collector layer) of the conventional fabrication method.

The npn transistor comprises the heavily doped n-type buried layer (112), wherein the buried layer (112) is formed to cover the bottom portion of the isolation trenches (115). The buried layer (112) comprises two regions for covering bottom portions of the isolation trenches (115) and both regions are connected electrically. Both the regions are formed to contact the well region (104) or formed to overlap a portion of well region (104). Each trench is preferably formed about 2 $\mu$m in width and 7 $\mu$m in depth for electrical connection of both regions with each other. Also, the distance between the two trenches is preferably about 6 $\mu$m.

The buried layer (112) is formed by an injection process preferably using P (phosphorus) ions, at a dose of 1.5E14 ions/cm$^2$ and an ion injecting voltage of 180 keV, and the diffusion process is preferably carried out in an N$_2$ (nitrogen) environment at 1200° C. for 150 minutes. In order to make these regions overlap with the well region (104), the injection process is preferably carried out using P (phosphorus) ions, at a dose of 1.5E13 ions/cm$^2$, and an ion injecting voltage of 180 keV and the diffusion process is preferably carried out in an N$_2$ (nitrogen) environment at 1200° C. for 150 minutes.

The npn transistor comprises the extrinsic base region (120) formed on the inside of well region (104) and on one side of each isolation trench (115), the intrinsic base region (124) formed between these extrinsic base regions (120) and on the inside of well region (104), and the emitter region (126) formed on the intrinsic base region (124). The npn transistor comprises the LOCOS device isolation layer (112) formed on the semiconductor substrate (100) including the isolation trench (115), and an insulating layer (128) formed on the semiconductor substrate (100) including the device isolation layer (122). Also, the npn transistor comprises metal patterns (129, 130) such as the emitter electrode, the base electrode (not shown) and the collector electrode, wherein the metal patterns (129, 130) are formed through the emitter region (126) and the extrinsic base region (120) and the isolation trench (115) in order to electrically connect with the buried layer respectively. A reference number 140 illustrates the flow of the collector current.

Figure 5:
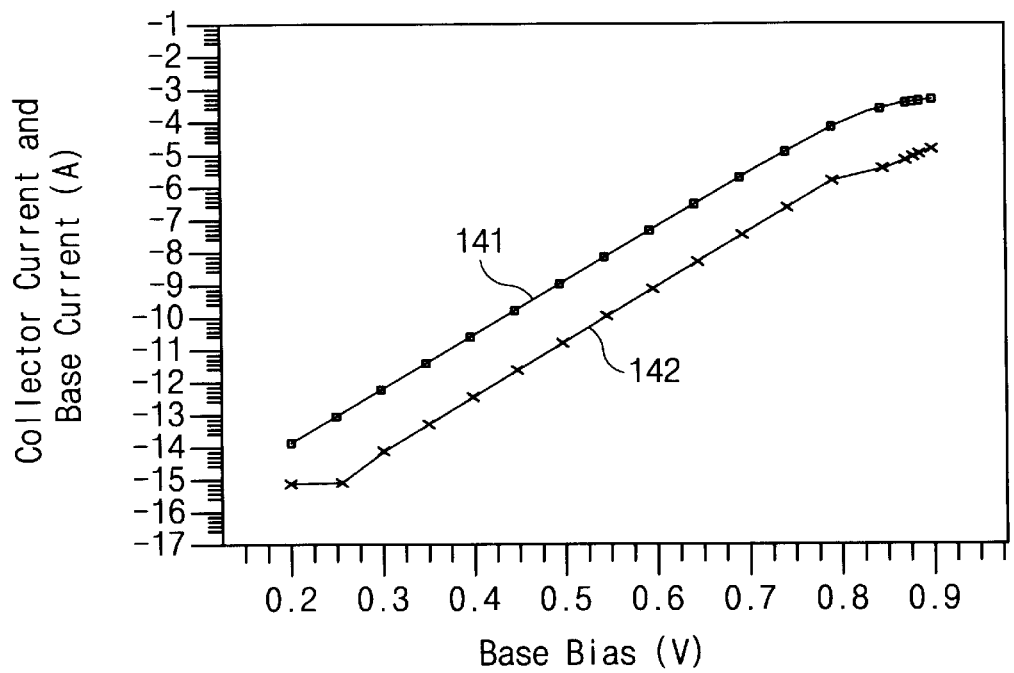
FIG. 5 is a Gummel plot of the bipolar transistor shown in FIG. 4

FIG. 5 is a Gummel plot of the bipolar transistor according to the embodiment of FIG. 4.

The reference number 141 illustrates the collector current, and the reference number 142 illustrates the base current.

Figure 6:
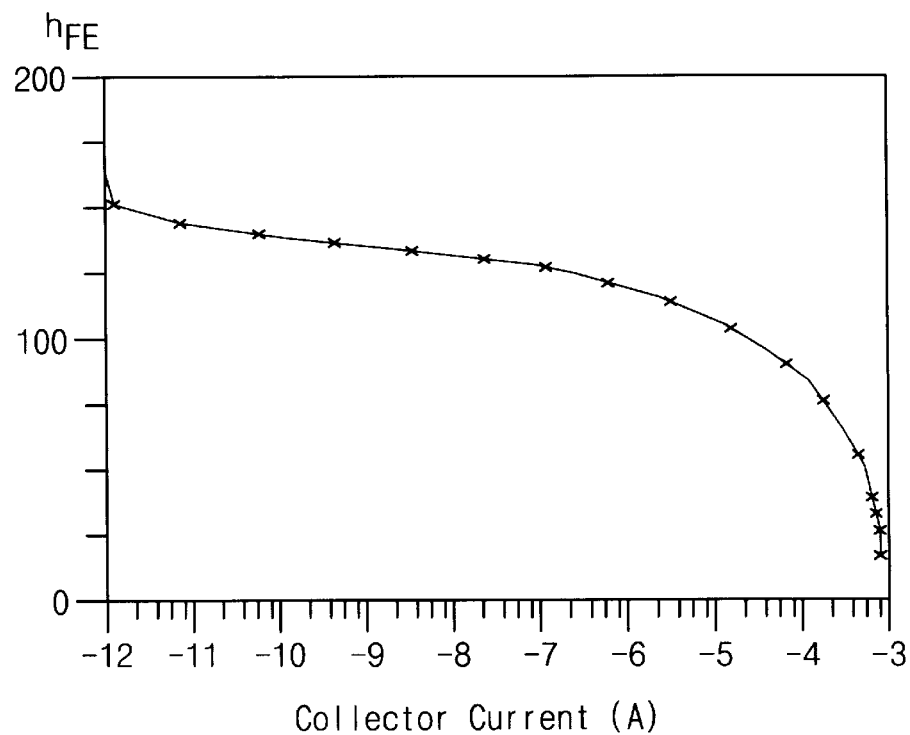
FIG. 6 is a graph showing a current gain with respect to a collector current of the bipolar transistor shown in FIG. 4.

FIG. 6 is a graph showing current gain with respect to the collector current of the bipolar transistor according to FIG. 4.

Figure 7:
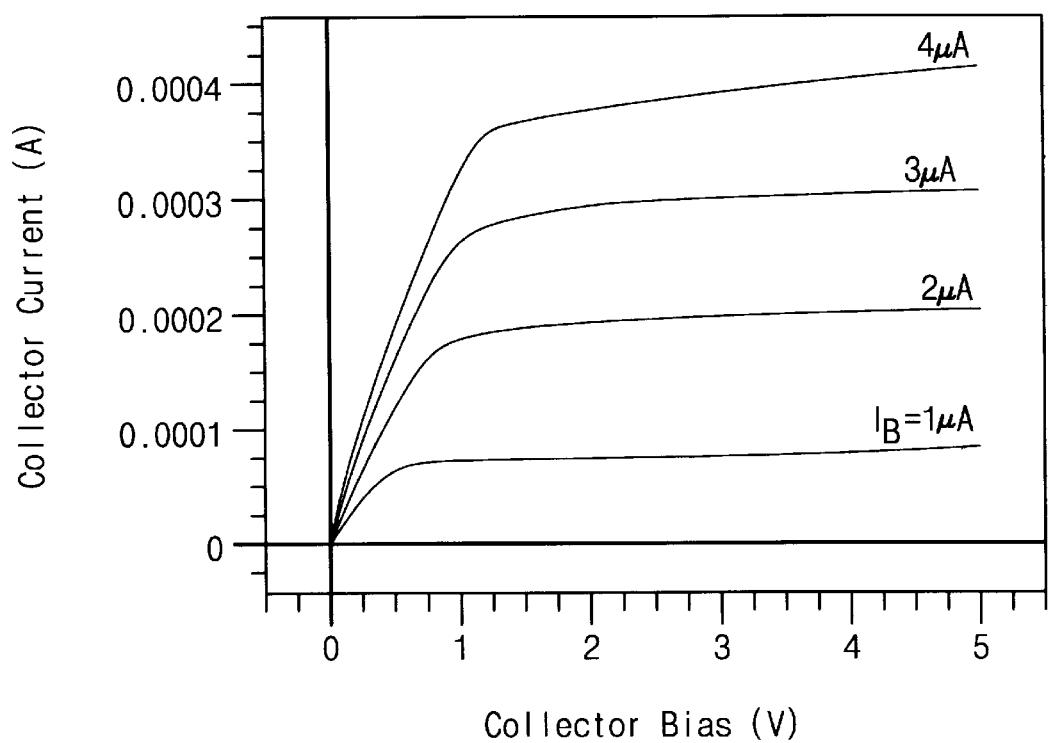
FIG. 7 is a graph showing I–V curves of the bipolar transistor shown in FIG. 4.

FIG. 7 is a graph showing an I–V curve of the bipolar transistor according to the present invention. FIG. 7 shows the current variation of the base current versus the collector current, wherein the base current has the values 1 $\mu$A, 2 $\mu$A, 3 $\mu$A and 4 $\mu$A.

The data of FIGS. 6 and 7 are verification plots produced by the ATLAS simulator, wherein ATLAS is a registered trademark of SILVACO Inc.

What is claimed is:

1. A method of fabricating a bipolar transistor, comprising:

forming a well region in a semiconductor substrate of a first conductivity type, said well region having first and second sides and having a second conductivity type;

etching the semiconductor substrate to form first and second trenches at the first and second sides of the well region, said trenches each having a bottom and first and second sides;

forming a first insulating layer on the first and second sidewalls of each trench;

injecting an impurity of the second conductivity type into the bottom of each trench to form a buried layer of the second conductivity type;

filling up each trench with a conductive layer so as to electrically connect the conductive layer to the buried layer;

forming a second insulating layer over the semiconductor substrate;

injecting an impurity of the first conductivity type into the semiconductor substrate using a masking layer whose pattern covers a central portion of the well region, to form an extrinsic base region;

forming a device isolation region on the semiconductor substrate using the masking layer;

removing the masking layer;

injecting an impurity of the first conductivity type, using the devive isolation region as a mask, to form an intrinsic base region; and injecting an impurity of the second conductivity type, using the device isolation region as a mask, to form an emitter region in the intrinsic base region.

2. The method of claim 1, wherein each of said first and second insulating layers are formed of an thermal oxide layer.

3. The method of claim 1, wherein filling up each trench with the conductive layer comprises:

forming a conducive layer on the first insulating layer, including the trenches;

planarizing the conductive layer on the semiconductor substrate to form the conductive layer in the trenches.

4. The method of claim 3, wherein said conductive layer is formed of a conductive polysilicon layer.

5. The method of claim 3, wherein said forming said conductive layer comprises:

forming a polysilicon layer on the first insulating layer, including the trenches;

doping the polysilicon layer with an impurity;

planarizing the polysilicon layer to form the conductive layer in the trenches.

6. The method of claim 3, wherein planarizing the conductive layer on the semiconductor substrate is performed using Chemical Mechanical Polishing (CMP).

* * * * *